US008648664B2

(12) United States Patent
Eldredge et al.

(10) Patent No.: US 8,648,664 B2
(45) Date of Patent: Feb. 11, 2014

(54) MUTUAL INDUCTANCE CIRCUITS

(75) Inventors: Adam B. Eldredge, Austin, TX (US); Susumu Hara, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 30 days.

(21) Appl. No.: 13/250,455

(22) Filed: Sep. 30, 2011

(65) Prior Publication Data

US 2013/0082793 A1  Apr. 4, 2013

(51) Int. Cl.
*H03B 5/08* (2006.01)
*H01F 27/28* (2006.01)

(52) U.S. Cl.
USPC ......... 331/167; 331/117 R; 336/232; 336/186

(58) Field of Classification Search
CPC ........ H03B 5/08; H03B 5/1296; H01F 5/003; H01F 17/0006; H01F 27/006; H01F 27/33; H01F 27/367; H01F 27/36; H01F 27/38; H01F 2017/0006; H01F 2017/0073; H01F 2017/008; H01F 2017/0086
USPC ..... 331/117 R, 117 FE, 167; 336/84 R, 84 C, 336/200, 223, 232, 226, 186
See application file for complete search history.

(56) References Cited

U.S. PATENT DOCUMENTS

| | | | |
|---|---|---|---|
| 3,988,665 A | 10/1976 | Neumaier et al. | |
| 5,027,185 A | 6/1991 | Liauh | |
| 5,083,236 A | 1/1992 | Chason et al. | |
| 5,373,112 A | 12/1994 | Kamimura et al. | |
| 5,446,311 A | 8/1995 | Ewen et al. | |
| 5,459,368 A | 10/1995 | Onishi et al. | |
| 5,461,353 A | 10/1995 | Eberhardt | |
| 5,559,360 A | 9/1996 | Chiu et al. | |
| 5,760,456 A | 6/1998 | Grzegorek et al. | |
| 5,793,272 A | 8/1998 | Burghartz et al. | |
| 5,884,990 A | 3/1999 | Burghartz et al. | |
| 5,918,121 A | 6/1999 | Wen et al. | |

(Continued)

FOREIGN PATENT DOCUMENTS

| | | |
|---|---|---|
| EP | 0 675 539 A2 | 10/1995 |
| JP | 362241311 A | 10/1987 |
| JP | 406053042 A | 2/1994 |
| WO | 02067326 A2 | 8/2002 |

OTHER PUBLICATIONS

Long, John R. and Miles A. Copeland, "The Modeling, Characterization, and Design of Monolithic Inductors for Silicon RF IC's," IEEE Journal of Solid-State Circuits, vol. 32, No. 3, pp. 357-369, Mar. 1997.

(Continued)

*Primary Examiner* — Ryan Johnson
(74) *Attorney, Agent, or Firm* — Abel Law Group, LLP

(57) ABSTRACT

An apparatus includes a first conductive loop coupled to conduct a first current and a second conductive loop coupled in parallel with the first conductive loop and further coupled to conduct a second current. A first conductive portion forms a part of the first conductive loop and the second conductive loop. The first conductive portion is coupled to conduct the first current and the second current. In at least one embodiment of the apparatus, the first conductive loop and the second conductive loop are planar inductors formed in a conductive layer on a substrate of an integrated circuit.

28 Claims, 6 Drawing Sheets

(56) References Cited

U.S. PATENT DOCUMENTS

| | | | |
|---|---|---|---|
| 5,959,515 | A | 9/1999 | Cornett et al. |
| 5,959,522 | A | 9/1999 | Andrews |
| 6,008,102 | A | 12/1999 | Alford et al. |
| 6,037,649 | A | 3/2000 | Liou |
| 6,046,109 | A | 4/2000 | Liao et al. |
| 6,054,329 | A | 4/2000 | Burghartz et al. |
| 6,114,937 | A | 9/2000 | Burghartz et al. |
| 6,124,624 | A | 9/2000 | Van Roosmalen et al. |
| 6,146,958 | A | 11/2000 | Zhao et al. |
| 6,153,489 | A | 11/2000 | Park et al. |
| 6,169,008 | B1 | 1/2001 | Wen et al. |
| 6,218,729 | B1 | 4/2001 | Zavrel, Jr. et al. |
| 6,362,525 | B1 | 3/2002 | Rahim |
| 6,373,369 | B2 | 4/2002 | Huang et al. |
| 6,389,691 | B1 | 5/2002 | Rinne et al. |
| 6,486,534 | B1 | 11/2002 | Sridharan et al. |
| 6,501,169 | B1 | 12/2002 | Aoki et al. |
| 6,534,843 | B2 | 3/2003 | Acosta et al. |
| 6,600,208 | B2 | 7/2003 | Brennan et al. |
| 6,653,557 | B2 | 11/2003 | Wolf et al. |
| 6,790,759 | B1 | 9/2004 | Wang et al. |
| 6,847,282 | B2 | 1/2005 | Gomez et al. |
| 6,873,065 | B2 | 3/2005 | Haigh et al. |
| 6,900,087 | B2 | 5/2005 | Lowther et al. |
| 6,900,538 | B2 | 5/2005 | Alter et al. |
| 6,917,105 | B2 | 7/2005 | Alter |
| 7,141,883 | B2 | 11/2006 | Wei et al. |
| 7,310,039 | B1 | 12/2007 | Zhang |
| 7,375,411 | B2 | 5/2008 | Zhang |
| 7,429,899 | B2 * | 9/2008 | Gabara ............... 331/117 R |
| 7,498,656 | B2 | 3/2009 | Zhang et al. |
| 7,501,924 | B2 | 3/2009 | Zhang |
| 2002/0140081 | A1 | 10/2002 | Chou et al. |
| 2004/0049745 | A1 | 3/2004 | Rahman et al. |
| 2004/0094822 | A1 | 5/2004 | Yu |
| 2004/0140862 | A1 | 7/2004 | Brown et al. |
| 2004/0178472 | A1 | 9/2004 | Zhang et al. |
| 2004/0222478 | A1 | 11/2004 | Zhang et al. |
| 2004/0222506 | A1 | 11/2004 | Wei et al. |
| 2004/0222511 | A1 | 11/2004 | Zhang |
| 2004/0257166 | A1 | 12/2004 | Wang |
| 2005/0269668 | A1 | 12/2005 | Zhang |
| 2005/0285683 | A1 | 12/2005 | Drost et al. |
| 2007/0075813 | A1 | 4/2007 | Zhang |
| 2007/0246805 | A1 | 10/2007 | Zhang et al. |
| 2008/0007358 | A1 * | 1/2008 | Gabara ............... 331/117 R |
| 2008/0084255 | A1 * | 4/2008 | El Rai et al. ............ 333/185 |

OTHER PUBLICATIONS

Tang, Chih-Chun, et al., "Miniature 3-D Inductors in Standard CMOS Process," IEEE Journal of Solid-State Circuits, vol. 37, No. 4, pp. 471-480, Apr. 2002.

Zannoth, Markus, et al., "A Fully Integrated VCO at 2 GHz," IEEE Journal of Solid-State Circuits, vol. 33, No. 12, pp. 1987-1991, Dec. 1998.

Zou, Jun, et al., Development of Vertical Planar Coil Inductors Using Plastic Deformation Magnetic Assembly (PDMA), IEEE International Microwave Symposium, 4 pages, May 2001.

Treleaven, Dave and James, Dick, "Integrated Circuit Passive Components," 4 pages, circa Nov. 1, 2011.

Tsui, Hau-Yiu and Jack Lau, "A 5GHz 56dB Voltage Gain 0.18μm CMOS LNA with Built-in Tunable Channel Filter for Direct Conversion 802.11a Wireless LAN Receiver," IEEE MTT-S Digest, pp. 225-228, Jun. 8-10, 2003.

* cited by examiner

| Conductive Loops | L (pH) | R (mOhms) | Q |
|---|---|---|---|
| 1 | 126 | 300 | 40 |
| 2 | 70 | 165 | 40 |
| 4 | 26 | 50 | 50 |
| 16 | 7 | 10 | 55 |

MUTUAL INDUCTANCE CIRCUITS

BACKGROUND

1. Field

The present application is generally directed to integrated circuits and more specifically to integrated circuits that include inductors.

2. Description of the Related Art

In general, electronic devices use inductors to store energy in magnetic fields. For example, integrated circuit oscillators (e.g., inductor-capacitor (LC) "tank" circuits) use inductors to generate oscillating signals for certain applications (e.g., inclusion in a narrow bandwidth phase-locked loop (PLL)). However, in those integrated circuit applications, a low-noise, high-Q (i.e., quality factor) LC oscillator is typically required. It is difficult to achieve a low-noise, high Q (e.g., Q>20) LC oscillator with conventional integrated circuit techniques. In addition, the inductors of the LC oscillator circuits are susceptible to electromagnetic interference from external sources of noise.

SUMMARY

In at least one embodiment of the invention, an apparatus includes a first conductive loop coupled to conduct a first current and a second conductive loop coupled in parallel with the first conductive loop and further coupled to conduct a second current. A first conductive portion forms a part of the first conductive loop and the second conductive loop. The first conductive portion is coupled to conduct the first current and the second current. In at least one embodiment of the apparatus, the first conductive loop and the second conductive loop are planar inductors formed in a conductive layer on a substrate of an integrated circuit.

In at least one embodiment of the invention, a method includes generating a magnetic field determined by first and second currents through a conductive portion shared by respective first and second conductive loops coupled in parallel. In at least one embodiment of the method, the magnetic field is based on a mutual inductance between the first and second conductive loops and the mutual inductance is determined by the conductive portion.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
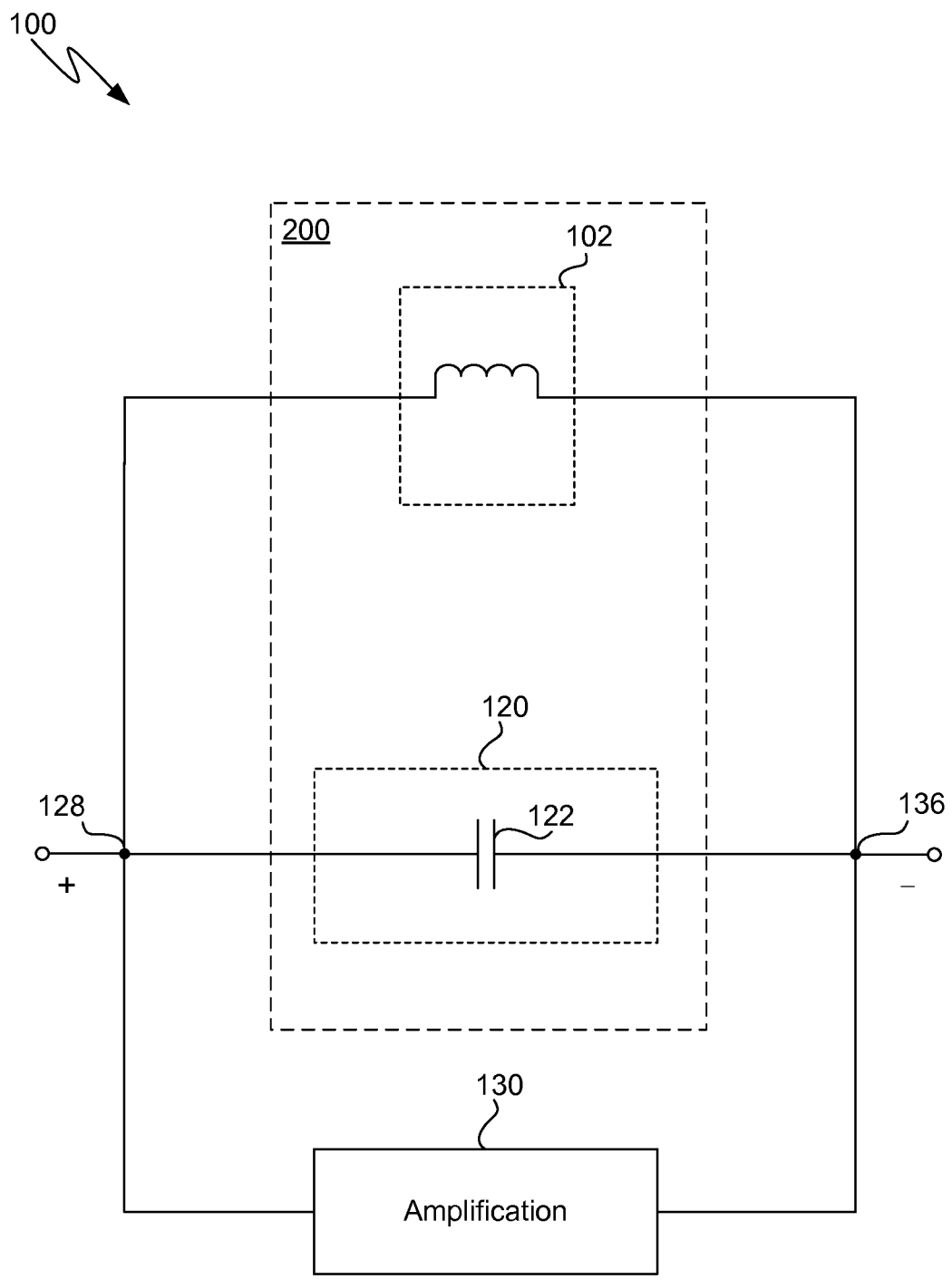
FIG. 1 is a schematic diagram of a circuit consistent with at least one embodiment of the invention.

Referring to FIG. 1, an exemplary LC oscillator circuit (e.g., circuit 100) includes circuit portion 200, which includes an inductor structure 102, and capacitive stage 120, which in at least one embodiment, includes capacitor 122. In at least one embodiment, capacitive stage 120 includes multiple capacitors. In at least one embodiment, capacitive stage 120 includes one or more variable capacitors that change an effective capacitance value of capacitive stage 120 in response to a control signal. In at least one embodiment of circuit portion 200, capacitive stage 120 includes one or more finger capacitor structures formed in one or more conductive integrated circuit layers.

In at least one embodiment, capacitor 122 stores energy in an electric field in response to a voltage across terminals 128 and 136. In the absence of a voltage on terminals 128 and 136, capacitor 122 discharges and generates a current through inductor structure 102, thereby transferring energy to a magnetic field. In at least one embodiment of circuit 100, after completely discharging capacitive stage 120 and biasing inductor structure 102, inductor structure 102 continues to provide current by extracting energy from the magnetic field. The current provided by inductor structure 102 charges capacitive stage 120 with a voltage of opposite polarity to the original charge on capacitive stage 120. When the magnetic field of inductor structure 102 is completely dissipated, the current will stop and the charge is stored in the capacitor, with the opposite polarity as before. Then, the cycle begins again, with the current flowing in the opposite direction through inductor structure 102, thereby generating an oscillating signal on nodes 128 and 136.

In at least one embodiment, circuit 100 includes amplification stage 130 having a predetermined gain. In at least one embodiment, amplification stage 130 injects energy into circuit 100 to initially charge capacitive stage 120 and to offset energy losses (e.g., energy losses due to the resistance of inductor structure 102). In at least one embodiment of circuit 100, amplification stage 130 includes cross-coupled inverters, such as complementary metal-oxide-semiconductor (CMOS) inverters, which may be coupled to amplify the oscillation signal by alternately pulling a voltage of one of nodes 128 and 136 up to $V_{DD}$ while pulling a voltage of the other of nodes 128 and 136 down to $V_{SS}$. In various other embodiments, amplification stage 130 may be an n-type metal-oxide-semiconductor (NMOS) amplifier, a differential pair amplifier that amplifies a difference between voltages at nodes 128 and 136, or other suitable circuits. It should be appreciated that FIG. 1 is illustrative and that additional embodiments of circuit 100 may encompass other oscillator circuits including an inductor, such as a Clapp oscillator circuit, a Colpitts oscillator circuit, a Hartley oscillator circuit, and/or other suitable oscillator circuits. In at least one embodiment of circuit 100, capacitive stage 120 and amplification stage 130 are formed in one or more integrated circuit layers below integrated circuit layers that form inductor structure 102.

A technique for reducing effects of noise in an LC oscillator includes increasing the energy of the circuit by coupling multiple LC oscillators in parallel. For example, coupling two oscillators in parallel increases the energy of the oscillator by a factor of two and reduces phase noise from that of a single oscillator by a factor of $\sqrt{2}$. Similarly, coupling four LC oscillators in parallel reduces the phase noise by a factor of two and increases the current by a factor of four. However, integrated circuit implementations of those oscillators consume significant area and power and therefore are impractical in some applications.

In at least one embodiment of an LC oscillator targeting a particular resonant frequency, the inductance L of the inductor, which typically occupies a substantial area, and capacitance C are chosen to reduce the area required by the inductor. However, at some point the reduction in inductance results in a capacitance corresponding to a capacitor having a substantial size. In addition, the inductance L of the inductor is proportional to the area of the inductor (i.e., proportional to the square of the inductor radius) and the resistance R of the inductor is proportional to the perimeter of the inductor (i.e., proportional to the inductor radius). Because the quality factor (Q) is proportional to L/R, Q is proportional to the radius of the inductor. As a result, as the size of the target inductance decreases, the Q of the inductor is decreased, which can degrade performance. For example, in general, the Q associated with a resonant circuit describes the ability of the circuit to produce a large output at a resonant frequency and also describes the selectivity of the circuit. In addition, the Q of a resonant circuit is inversely related to interference from outside sources.

In at least one embodiment of an LC oscillator, a particular inductance value is achieved by placing a number of inductors in parallel to decrease the effective inductance of the inductor structure and to achieve the target phase noise. In addition to reducing the effective inductance, placing inductors in parallel reduces the sensitivity of the inductor structure to magnetic fields. For example, a two-loop arrangement is less susceptible to external electromagnetic interference (e.g., far field interference sources in particular) because induced current flow in one such coil is offset by an opposite current flow induced in the other coil.

Figure 2:
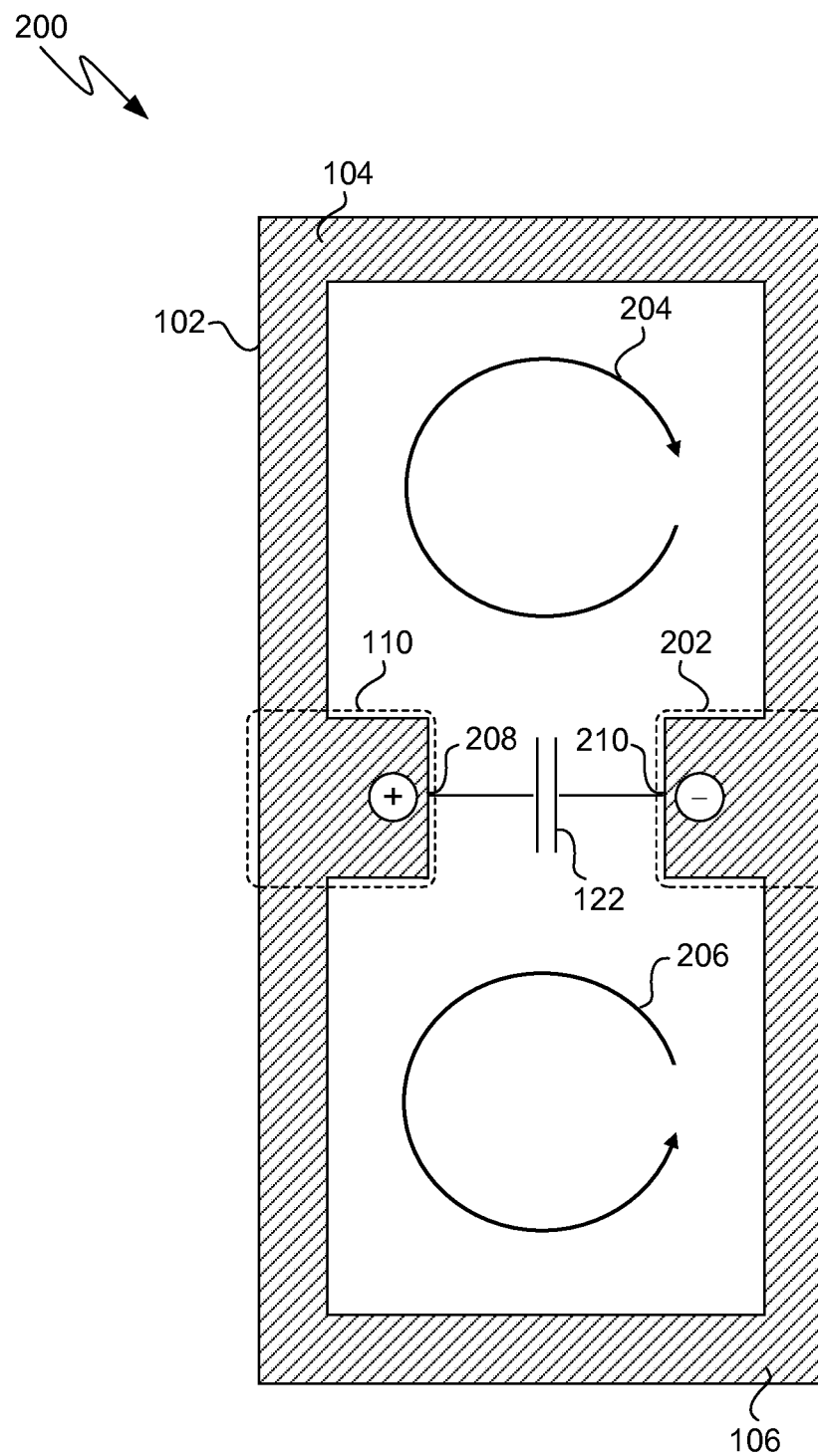
FIG. 2 is a plan view diagram of an integrated circuit inductor structure that includes multiple conductive loops consistent with at least one embodiment of the invention.

Referring to FIG. 2, in at least one embodiment of circuit portion 200, inductor structure 102 includes multiple conductive loops formed in one or more conductive layers of an integrated circuit. As referred to herein, a conductive layer may be a typical conductive integrated circuit layer, an ultra-thick conductive layer having a thickness substantially greater than a typical integrated circuit conductive layer, an after-passivation conductive layer, or other suitable integrated circuit conductive layer formed above a substrate of an integrated circuit. In at least one embodiment, inductor structure 102 includes two parallel-connected inductor coils (e.g., conductive loops 104 and 106, each including a single inductor turn). In at least one embodiment of inductor structure 102, conductive loops 104 and 106 share (i.e., each include) conductive portion 110, which enables inductor structure 102 to have low-L and high-Q for a given area, as described further below. In at least one embodiment of inductor structure 102, sharing conductive portion 110 between conductive loops 104 and 106 increases a mutual inductance between conductive loops 104 and 106, which in at least one embodiment, enables inductor structure 102 to exhibit low-L and high-Q for a given area.

Conductive loops 104 and 106 may be of various shapes. In general, a circular shape is a desirable shape for conductive loops 104 and 106 because the circular shape has a maximum area for a particular perimeter, and provides a maximum Q for a particular inductance. However, for circular conductive loops, the portion shared between the conductive loops is a point, which may generate less mutual inductance between the conductive loops as compared to polygon conductive loops. Further, circular conductive loops may be impractical in some applications, for example due to design rules. Accordingly, in at least one embodiment, conductive loops 104 and 106 are n-sided polygons, as described further below.

Still referring to FIG. 2, in at least one embodiment of circuit portion 200, conductive loop 104 includes the top half shaded portion of circuit portion 200 and conductive loop 106 includes the bottom half shaded portion of circuit portion 200. In at least one embodiment, conductive loops 104 and 106 share at least one conductive portion of one side of the conductive loop. In at least one embodiment, conductive loops 104 and 106 share conductive portion 110 (e.g., conductive loops 104 and 106 each include conductive portion 110). In at least one embodiment, conductive loops 104 and 106 share at least one conductor portion of one side of the conductive loop. In at least one embodiment, conductive loops 104 and 106 share conductive portion 202 alternatively or in addition to conductive portion 110. In at least one embodiment of circuit portion 200, conductive loops 104 and 106 are n-sided polygons, where one or both of conductive portions 110 and 202 form part of a side shared between the polygon conductive loops or form an entire side shared between the polygon conductive loops. In at least one embodiment of circuit portion 200, conductive portion 202 and conductive portion 110 are separated from each other by a gap, which may be filled with dielectric material. In at least one embodiment of circuit portion 200, inductor structure 102 includes more than two conductive loops coupled in parallel, as described further below.

In at least one embodiment, circuit portion 200 further includes capacitor 122, which is coupled to conductive loops 104 and 106. Note that capacitor 122 is only represented by an electrical symbol and may have any suitable integrated circuit structure. In at least one embodiment of circuit portion 200, terminals of capacitor 122 are coupled to terminals of conductive loops 104 and 106 (e.g., any suitable interconnect structures coupled to conductive portions 110 and 202). In at least one embodiment of circuit portion 200, connections 208 and 210 include conductive vias that couple structures formed in different integrated circuit layers. In at least one embodiment of circuit portion 200, conductive portion 110 is distinct from and does not include connection 208 (e.g., conductive portion 110 may be of a different conductive material or size than connection 208).

In at least one embodiment of circuit portion 200, current flows from a positive terminal of conductive loops 104 and 106 to a negative terminal of conductive loops 104 and 106 in directions 204 and 206, respectively. For example, in at least one embodiment of circuit portion 200, a current generated by discharge of capacitor 122 is received at connection 208, flows through conductive portion 110, and separated into currents flowing through conductive loops 104 and 106, respectively.

In at least one embodiment of circuit portion 200, currents flowing through conductive loops 104 and 106 rotate in opposite directions, e.g., in directions 204 and 206, respectively. In at least one embodiment of circuit portion 200, currents 204 and 206 are combined at conductive portion 202. In at least one embodiment of circuit portion 200, the combined current is delivered from conductive portion 202 to capacitor 122 through connection 210 (e.g., a conductive via). In at least one embodiment of circuit portion 200, conductive portion 202 is distinct from and does not include connection 210 (e.g., conductive portion 202 may be of a different conductive material or size than connection 210).

In at least one embodiment of circuit portion 200, sharing one or both of conductive portions 110 and 202 increases a mutual inductance between conductive loops 104 and 106 and reduces an area occupied by circuit portion 200, as compared to two entirely separate conductive loops. In at least one embodiment of circuit portion 200, the increased mutual inductance between conductive loops 104 and 106 increases an inductance associated with circuit portion 200 and enables circuit portion 200 to achieve a higher Q than circuit portion 200 including two entirely separate conductive loops. Further, in at least one embodiment of circuit portion 200, sharing one or both of conductive portions 110 and 202 decreases parasitic capacitance associated with conductive loops 104 and 106, which increases a self-resonant frequency (SRF) associated with conductive loops 104 and 106. In at least one embodiment of circuit portion 200, the widths of conductive portions 110 and 202 are selected to achieve a particular resistance R (e.g., are wider than unshared portions of conductive loops 104 and 106 to achieve a lower R), which may further increase the Q-factor of circuit portion 200. For example, in at least one embodiment of circuit portion 200, the width of conductors 110 and 202 is twice the width of other portions of conductive loops 104 and 106.

Figure 3:
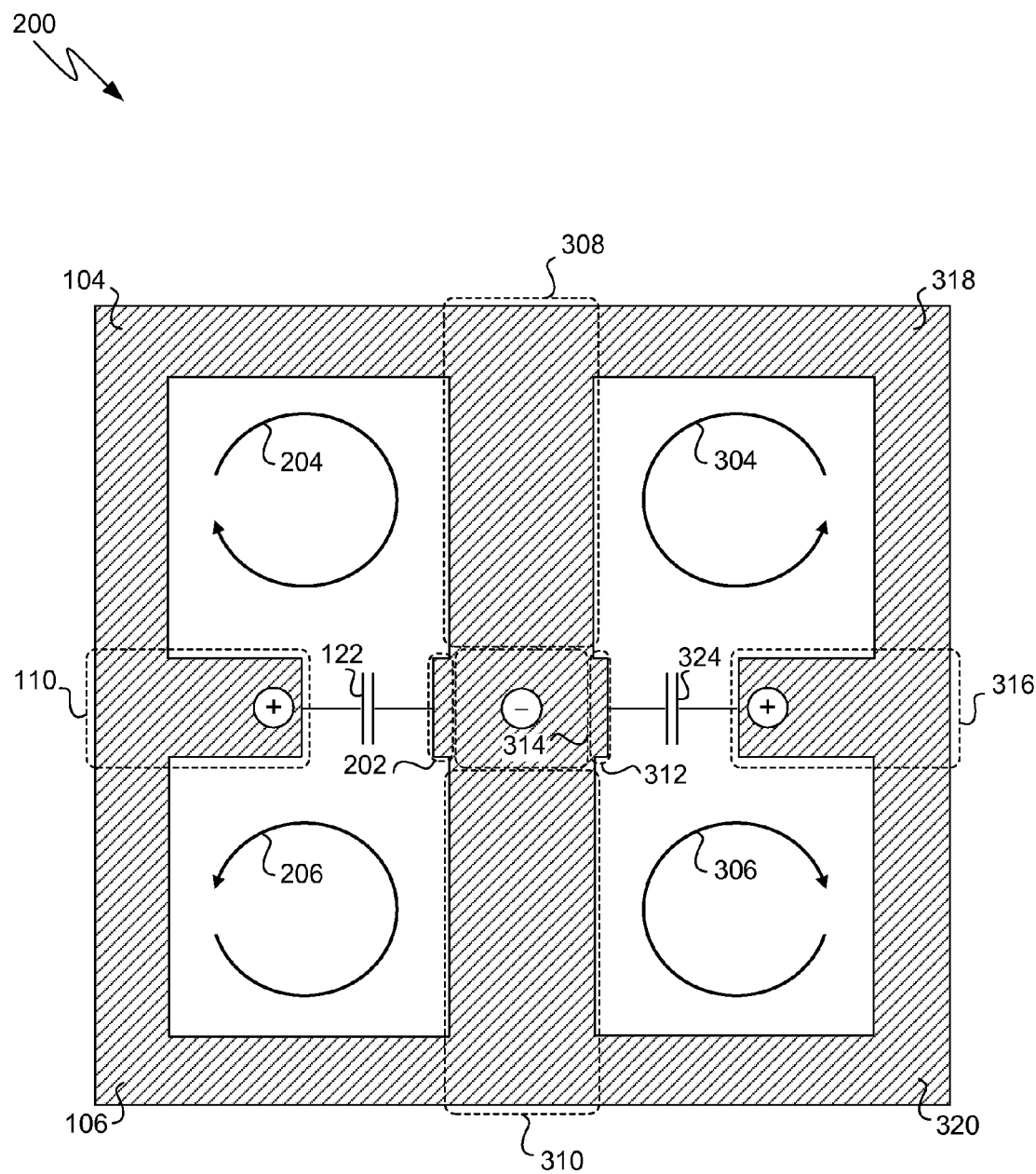
FIG. 3 is a plan view diagram of an embodiment of the integrated circuit inductor structure of FIG. 2 that includes additional conductive loops consistent with at least one embodiment of the invention.

Referring to FIG. 3, in at least one embodiment of circuit portion 200, additional conductive loops are coupled in parallel with conductive loops 104 and 106. In at least one embodiment of circuit portion 200, conductive loops 104 and 106 share conductive portions with conductive loops 318 and 320. In at least one embodiment, conductive loop 318 shares conductive portion 316 with conductive loop 320. Further, in at least one embodiment of circuit portion 200, conductive loops 318 and 320 share conductive portion 312 alternatively or in addition to conductive portion 316. In at least one embodiment of circuit portion 200, conductive loops 104 and 318 share conductive portion 308, which combines currents flowing through conductive loops 104 and 318. In at least one embodiment of circuit portion 200, conductive loops 106 and 320 share conductive portion 310, which combines currents flowing through conductive loops 106 and 320. In at least one embodiment of circuit portion 200, currents flowing through conductive loops 318 and 320 rotate in opposite directions, e.g., in directions 304 and 306, respectively. In addition, note that current flowing in conductive loop 318 rotates in a direction opposite to the current flowing in conductive loop 104. Similarly, current flowing in conductive loop 320 rotates in a direction opposite to the current flowing in conductive loop 106.

In at least one embodiment of circuit portion 200, capacitors 122 and 324 are formed in one or more integrated circuit layers different than one or more integrated circuit layers in which conductive loops 104, 106, 318, and 320 are formed. In at least one embodiment, capacitors 122 and 324 are coupled to conductive loops 104 and 106 and conductive loops 318 and 320, respectively using any suitable manufacturing techniques (e.g., using conductive vias). In at least one embodiment, conductive loops 104, 106, 318, and 320 are single-turn, planar inductors that are substantially oriented in a common plane (e.g., the plane defined by FIG. 3) and in a single conductive layer of an integrated circuit.

In at least one embodiment of circuit portion 200, each conductive loop 104, 106, 318, and 320 shares at least one conductive portion on two sides of the conductive loop with each of the adjacent conductive loops. In at least one embodiment of circuit portion 200, each conductive loop 104, 106, 318, and 320 shares a conductive portion with each of the other conductive loops 104, 106, 318, and 320. For example, conductive loops 104, 106, 318, and 320 share conductive portion 314. In at least one embodiment of circuit portion 200, currents flowing in conductive loops 104, 106, 318, and 320 are combined in conductive portion 314. In at least one embodiment of circuit portion 200, sharing conductive portions increases the mutual inductance, increases the Q, and reduces the area associated with circuit portion 200, as compared to a circuit portion including multiple conductive loops that does not share conductive portions.

In at least one embodiment of circuit portion 200, conductive loops 104, 106, 318, and 320 all share a conductive portion (e.g., conductive portion 314), which reduces an area occupied by circuit portion 200 while still maintaining a low equivalent inductance. For example, in at least one embodiment, circuit portion 200 occupies an area of approximately 0.09 mm$^2$ (e.g., sides of circuit portion 200 may each be approximately 300 μm). In at least one embodiment of circuit portion 200, each of capacitors 122 and 324 occupies approximately one-eighth an area occupied by conductive loop 104, 106, 318, or 320, which may be advantageous in applications where design criteria afford a relatively small area to circuit portion 200. It should be noted that such dimensions are illustrative and that structure dimensions generally vary among different applications.

In at least one embodiment of circuit portion 200, external electromagnetic signals induce eddy currents in a substrate of the integrated circuit including circuit portion 200, thereby reducing the associated Q. In at least one embodiment, the Q associated with circuit portion 200 is increased by including a shielding structure that reduces or eliminates effects of external electromagnetic signals. In at least one embodiment of circuit portion 200, a shielding structure is not used.

Figure 4:
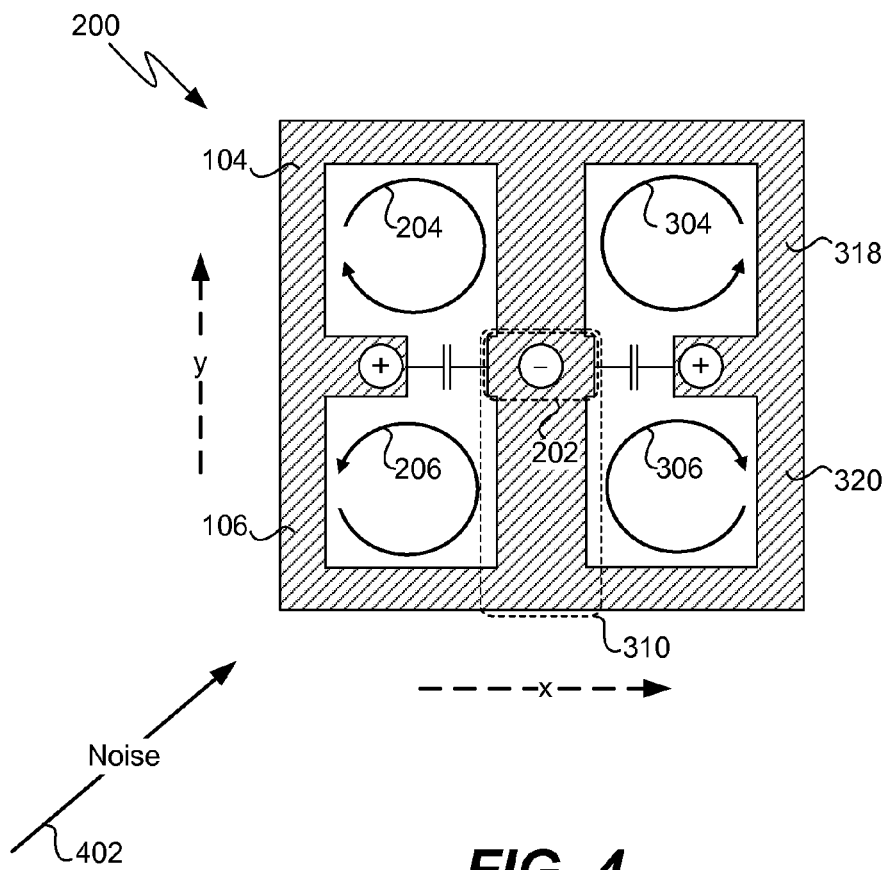
FIG. 4 illustrates an external noise signal and a plan view diagram of an embodiment of the integrated circuit inductor structure of FIG. 2 operable to reduce effects of noise (e.g., effects of interfering electromagnetic signals) consistent with at least one embodiment of the invention.

Referring to FIG. 4, in at least one embodiment, circuit portion 200 reduces effects of noise (e.g., effects of interfering electromagnetic signals), which can introduce spurious voltages or currents that increase jitter and/or reduce the associated Q. Since circuit portion 200 includes a two-dimensional layout of conductive loops, noise signal 402 can affect circuit portion 200 in multiple dimensions, e.g., in a direction along an x-axis and a direction along a y-axis. However, in at least one embodiment of circuit portion 200, conductive loops 104, 106, 318, and 320 provide common-mode rejection of the noise signal.

For example, noise signal 402 will affect the currents in conductive loops 104, 106, 318, and 320 with different polarities. Since the current flowing in conductive loop 104 rotates in direction 204, which is opposite to direction 304 of current flowing in conductive loop 318 and the current flowing in conductive loop 106 rotates in direction 206, which is opposite to direction 306 of current flowing in conductive loop 320, the combination of currents flowing in conductive loops 104 and 318 and the combination of currents flowing in conductive loops 106 and 320 substantially offset or cancel the net effects of noise across circuit portion 200 in the x-dimension. Similarly, since the current flowing in conductive loop 104 rotates in direction 204, which is opposite to direction 206 of current flowing in conductive loop 106 and the current flowing in conductive loop 318 rotates in direction 304, which is opposite to direction 306 of current flowing in conductive loop 320, the combination of currents flowing in conductive loops 104 and 106 and the combination of currents flowing in conductive loops 318 and 320 substantially offset or cancel the net effects of noise across circuit portion 200 in the y-dimension. In at least one embodiment of circuit portion 200, the common mode reduction of noise extends to a third axis orthogonal to the x-axis and the y-axis (e.g., a z-axis).

Figure 5:
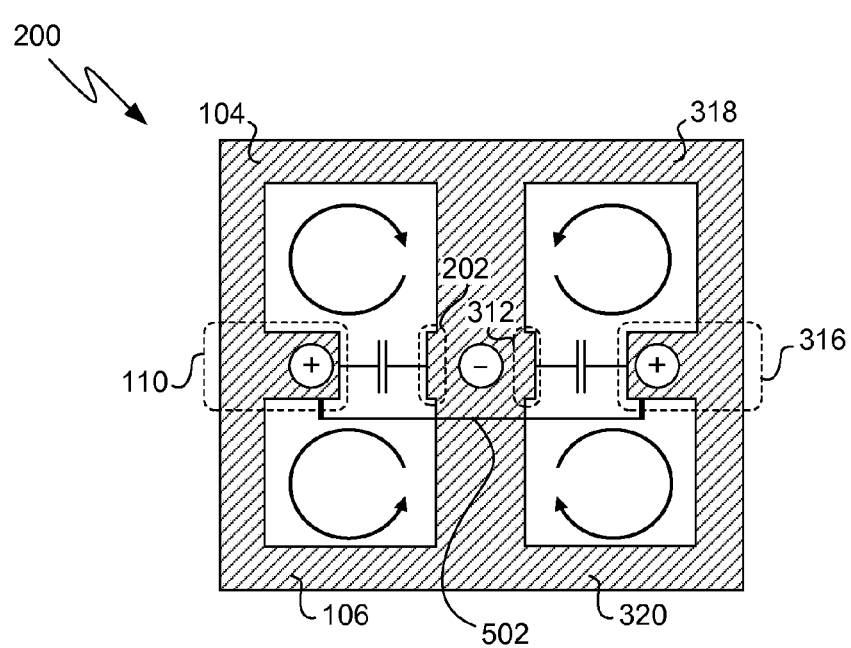
FIG. 5 is a plan view diagram of an embodiment of the integrated circuit inductor structure of FIG. 2 that includes an additional conductive portion consistent with at least one embodiment of the invention.

Referring to FIG. 5, in at least the embodiment of circuit portion 200, in order to effectively couple multiple conductive loops in parallel, an additional conductive portion is included. For example, to couple all four of conductive loops 104, 106, 318, and 320 in parallel, conductive portion 502 couples conductive portions 110 and 316. Ideally, conductive loops 104, 106, 318, and 320 and the associated capacitors are perfectly matched, making circuit portion 200 perfectly balanced, and no current flows in conductive portion 502. In at least one embodiment of circuit portion 200, some mismatch occurs in the manufacture of circuit portion 200 and some current flows in conductive portion 502. In at least one embodiment of circuit portion 200, additional conductive portion 502 is formed in the same conductive layer on a substrate of an integrated circuit as the conductive layer including conductive loops 104, 106, 318, and 320. In at least one embodiment of circuit portion 200, additional conductive portion 502 is formed in a conductive layer above the substrate different from the conductive layer including conductive loops 104, 106, 318, and 320. In at least one embodiment of circuit portion 200, conductive portion 502 is formed in an after-passivation (AP) layer formed on a substrate of the integrated circuit. In at least one embodiment of circuit portion 200, conductive loops 104, 106, 318, and 320 are formed in an ultra-thick conductive layer, an AP layer, a post-passivation interconnect (PPI) layer, or a combination thereof.

In at least one embodiment of circuit portion 200, conductive portions 110 and 316 each have larger areas than conductive portions 202 and 312. For example, in at least one embodiment of circuit portion 200, gaps between conductive portions 110 and 202 and conductive portions 312 and 316, respectively, are positioned relatively close to the center of circuit portion 200. In at least one embodiment of circuit portion 200, positioning conductive portions 202 and 312 relatively close to the center of circuit portion 200 enables conductive portion 502 to be of a reduced length and therefore to have a lower resistance, which reduces energy loss associated with any current through conductive portion 502 (e.g., current associated with manufacturing mismatches between components of circuit portion 200). In at least one embodiment of circuit portion 200, conductive portion 110 has an area that is at least twice an area of conductive portion 202 and conductive portion 316 has an area that is at least twice an area of conductive portion 312.

Figure 6:
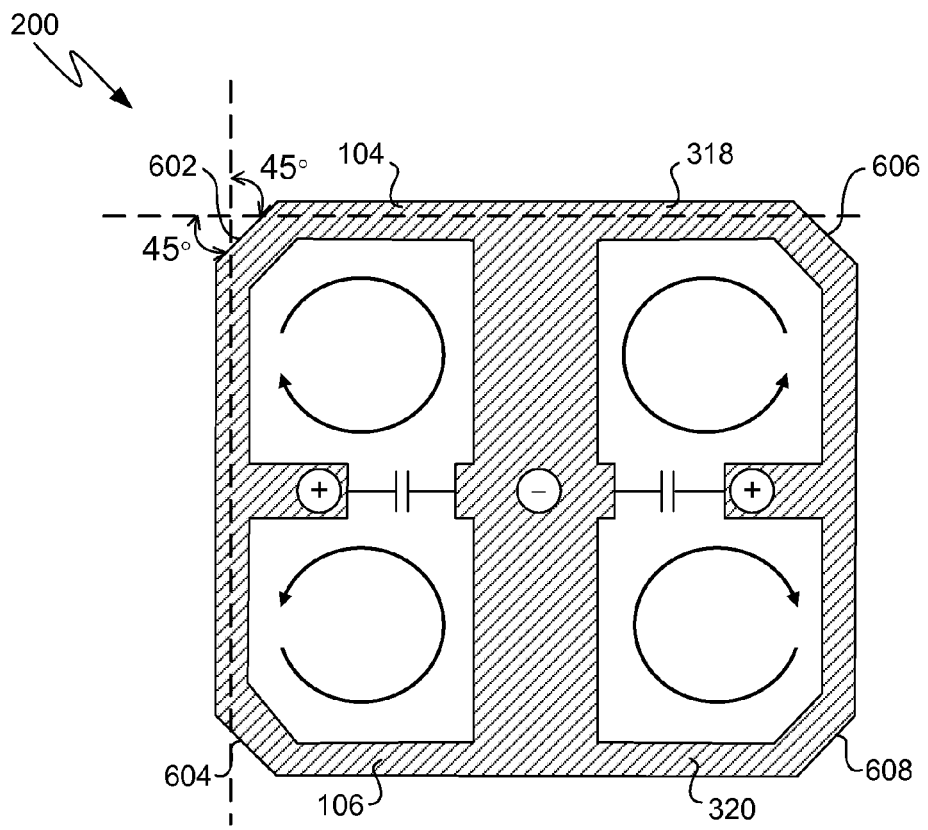
FIG. 6 is a plan view diagram of an embodiment of the integrated circuit inductor structure of FIG. 2 that approximates a circular shape using a polygon in accordance with manufacturing design rules consistent with at least one embodiment of the invention.

Referring to FIG. 6, in at least one embodiment of circuit portion 200, a circular shape is approximated using a polygon in accordance with manufacturing design rules. For example, at least one embodiment of circuit portion 200 includes one or more "rounded" corners, such as corners 602, 604, 606, and 608. In at least one embodiment of circuit portion 200, corners 602, 604, 606, and 608 are formed as conductive structures at angles approximately 45 degrees or 135 degrees with other conductive structures of conductive loops 104, 106, 318, and 320. Such rounding of corners may be determined according to design parameters such as space considerations, design rules, and other criteria. In at least one embodiment of circuit portion 200, conductive loops 104, 106, 318, and 320 are each circular or substantially circular. For example, in some applications, circular conductive loops are used to increase a ratio of area to perimeter for conductive loops 104, 106, 318, and 320, thus increasing Q. However, as will be appreciated, shared conductive portions of circular or substantially circular conductive loops may be smaller than shared areas of rectangular conductive loops, thus circular or substantially circular conductive loops having shared portions may achieve lesser reduction in area of circuit portion 200 from a circuit portion 200 that does not share conductive portions.

Figure 7:
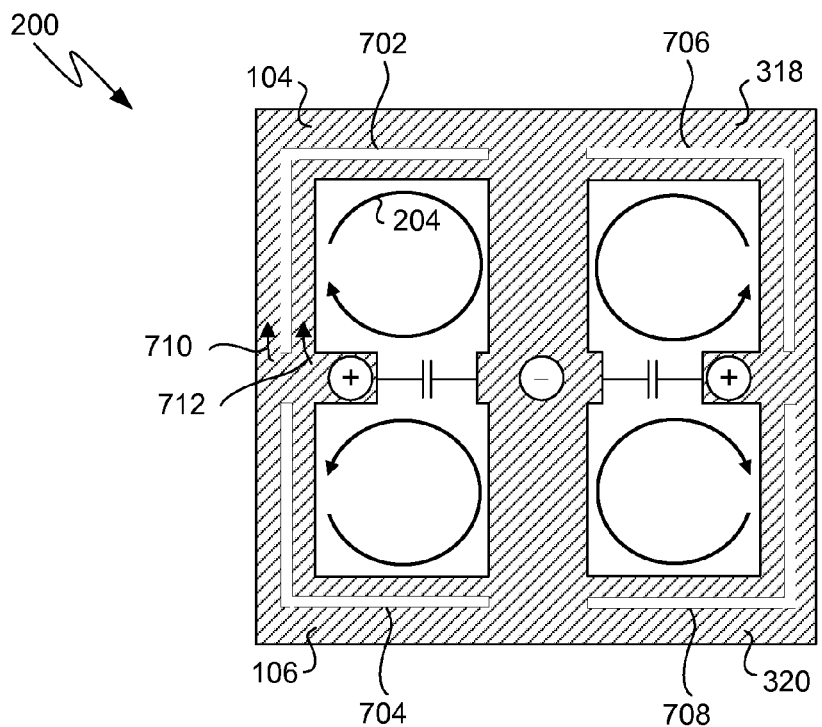
FIG. 7 is a plan view diagram of an embodiment of the integrated circuit inductor structure of FIG. 2 that includes one or more slots consistent with at least one embodiment of the invention.

Referring to FIG. 7, in at least one embodiment, circuit portion 200 includes one or more "slots," such as slots 702, 704, 706, and 708. As used herein, "slot" refers to a gap in a conductive loop that may be filled with an insulating material or other similar structure. In at least one embodiment of circuit portion 200, slot 702 causes distribution of current flowing in conductive loop 104 into currents 710 and 712 (e.g., by distributing a portion of the current in a peripheral direction). In at least one embodiment of circuit portion 200, slot 702 reduces crowding of current flowing through conductive loop 104 to the inside perimeter of conductive loop 104. In at least one embodiment of circuit portion 200, reducing crowding of current flowing through conductive loop 104 reduces the effective internal resistance of conductive loop 104, which increases the Q associated with circuit portion 200. In at least one embodiment of circuit portion 200, slots 704, 706, and 708 reduce current crowding in conductive loops 106, 318, and 320, respectively.

Figures 8, 9:
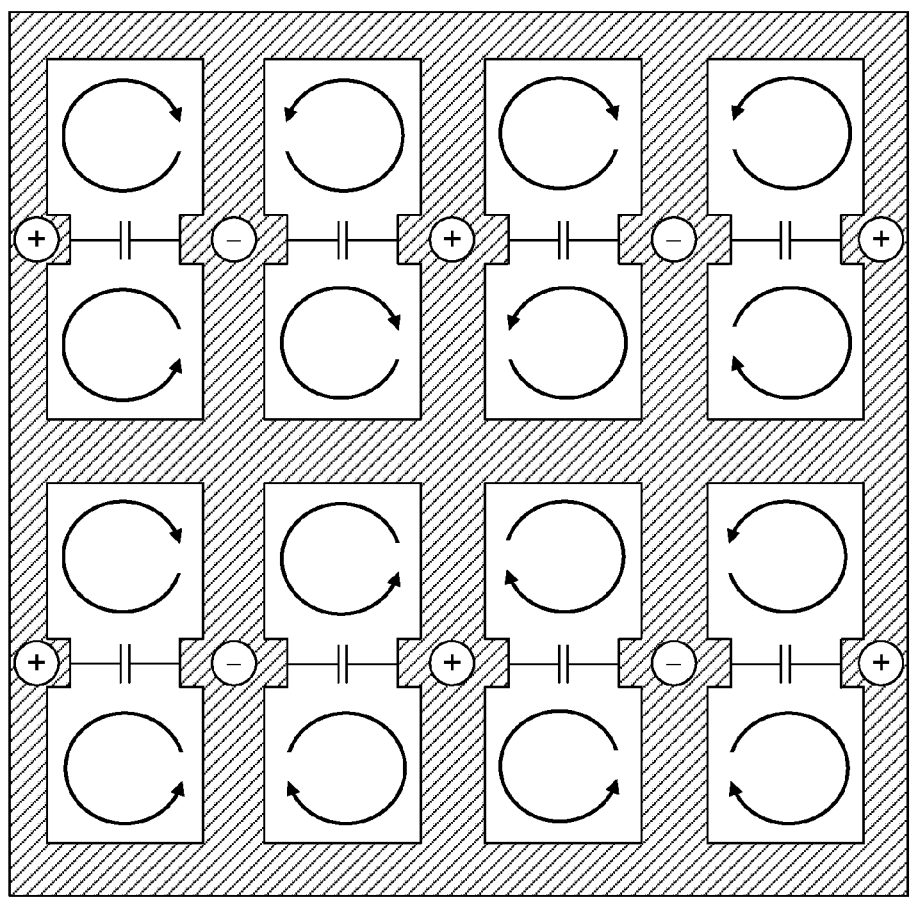
FIG. 8 is a plan view diagram of an embodiment of the integrated circuit inductor structure of FIG. 2 that includes a different number of conductive loops coupled in parallel consistent with at least one embodiment of the invention.
FIG. 9 is a table of exemplary parameters consistent with various embodiments of the invention.

Referring to FIG. 8, in at least one embodiment, circuit portion 200 has a different effective inductance including a different number of conductive loops coupled in parallel. For example, effective inductances of approximately L/n are achieved by coupling n conductive loops in parallel, each conductive loop having an inductance L and where n is an integer. In at least one embodiment of circuit portion 200, n is 16 and the conductive loops are formed in a 4×4 configuration, which maximizes the number of shared sides of each conductive loop, thereby increasing the associated Q. However, in other embodiments of circuit portion 200, the same number of conductive loops (e.g., n=16) are formed in other suitable configurations (e.g., 8×2, 16×1). Note that conductive loops on the perimeter of circuit portion 200 of FIG. 8 share conductive portions on at least two sides of the conductive loop with adjacent conductive loops. Those conductive loops that are on the perimeter of circuit portion 200, but not in a corner position, share three sides of the conductive loop with adjacent conductive loops. In addition, conductive loops in the interior of the 4×4 configuration (i.e., conductive loops not on the perimeter of the 4×4 configuration) share conductive portions on all sides of the conductive loop. It should be noted that in at least the embodiment of FIG. 8, conductive loops in the interior of the 4×4 configuration share entire sides with adjacent conductive loops (e.g., the entire periphery of each of the interior conductive loops is shared with an adjacent conductive loop). It should further be noted that in at least one embodiment, the shared sides of the conductive loops may include conductive portions 110, 202, 314, and 316 described with reference to FIGS. 2-5. In general, in at least one embodiment, up to all sides of a polygon conductive loop may be shared with adjacent conductive loops. It will be appreciated that increasing the number of shared sides of the conductive loop reduces the area of an inductor formed by the n inductors, reduces the capacitance to the substrate, thereby increasing the self-resonant frequency, and increases the mutual inductance and energy stored, thereby increasing the associated Q.

Referring back to FIG. 1, in at least one embodiment, the number of conductive loops of inductor structure 102 may be selected to achieve a particular phase noise of the LC oscillator circuit and a particular equivalent inductance of inductor structure 102 and increase the Q associated the LC oscillator circuit. Referring to FIG. 9, table 900 illustrates exemplary parameters consistent with various embodiments of circuit portion 200 disclosed herein. In general, as the number of conductive loops increases, circuit portion 200 achieves lower effective inductance and reduced resistance associated with the conductive loops, thereby increasing the associated Q.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, although the invention is described with regard to inductor structures included in oscillator applications, inductor structures consistent with the teachings herein may be included in filter circuits, isolation circuits, or other applications that use storage of energy in an inductor. Other variations and modifications of the embodiments disclosed herein may be made based on the description set forth herein, without departing from the scope of the invention as set forth in the following claims.

What is claimed is:

1. An apparatus comprising:
a first conductive loop coupled to conduct a first current; and
a second conductive loop coupled in parallel with the first conductive loop and further coupled to conduct a second current:
a third conductive loop; and
a fourth conductive loop coupled in parallel with the first, second, and third conductive loops,
wherein a first conductive portion forms a part of the first conductive loop and a part of the second conductive loop, the first conductive portion coupled to conduct the first current and the second current,
wherein each side of each of the first, second, third, and fourth conductive loops includes a conductive portion shared with an adjacent conductive loop.

2. The apparatus as recited in claim 1,
wherein the first current rotates in a first direction and the second current rotates in a second direction opposite to the first direction.

3. The apparatus as recited in claim 1,
wherein the first conductive loop and the second conductive loop are planar inductors formed in a conductive layer on a substrate of an integrated circuit.

4. The apparatus as recited in claim 1 further comprising:
an oscillator circuit including the first conductive loop, the second conductive loop, and a capacitor coupled in parallel with the first conductive loop and the second conductive loop.

5. The apparatus as recited in claim 1,
wherein the first conductive loop and the second conductive loop further share a second conductive portion that forms a part of the first conductive loop and a part of the second conductive loop, the first conductive portion and the second conductive portion being separated by a gap, the first conductive portion including a first terminal and the second conductive portion including a second terminal, the first and second terminals being configured to couple the first conductive loop in parallel with the second conductive loop.

6. The apparatus as recited in claim 1,
wherein the first conductive loop and the second conductive loop are inductors that are substantially single-turn.

7. The apparatus as recited in claim 1, wherein the first conductive loop and the second conductive loop are each n-sided polygons and the first conductive portion forms a portion of a first side of the first conductive loop and the first conductive portion forms a portion of a second side of the second conductive loop.

8. The apparatus as recited in claim 1, wherein a current flowing through the first conductive portion separates into the first current flowing through another portion of the first conductive loop and the second current flowing through another portion of the second conductive loop.

9. The apparatus as recited in claim 1, wherein the first conductive loop includes a slot that causes distribution of current flowing in the first conductive loop.

10. The apparatus as recited in claim 1, wherein the width of the first conductive portion is approximately twice the width of other portions of the first conductive loop and approximately twice the width of other portions of the second conductive loop.

11. An apparatus comprising:
a first conductive loop coupled to conduct a first current; and
a second conductive loop coupled in parallel with the first conductive loop and further coupled to conduct a second current;
wherein a first conductive portion forms a part of the first conductive loop and a part of the second conductive loop, the first conductive portion coupled to conduct the first current and the second current,
wherein the first conductive loop and the second conductive loop are each n-sided polygons, the first conductive portion forms an entire first side of the first conductive loop, and the first conductive portion forms an entire second side of the second conductive loop.

12. The apparatus as recited in claim 11, further comprising:
a third conductive loop; and
a fourth conductive loop coupled in parallel with the first, second, and third conductive loops.

13. The apparatus as recited in claim 12,
wherein a second conductive portion forms a part of the first conductive loop and the third conductive loop, and
wherein a third conductive portion forms a part of the second conductive loop and the fourth conductive loop.

14. The apparatus as recited in claim 13,
wherein a fourth conductive portion forms a part of the third conductive loop and the fourth conductive loop.

15. The apparatus as recited in claim 14 further comprising:
an additional conductive portion coupling the first conductive portion to the fourth conductive portion.

16. The apparatus as recited in claim 14 further comprising:
a fifth conductive portion that forms a portion of the first, second, third, and fourth conductive loops.

17. The apparatus as recited in claim 12,
wherein each side of each of the first, second, third, and fourth conductive loops includes a conductive portion shared with an adjacent conductive loop.

18. The apparatus as recited in claim 11, wherein every side of the first conductive loop includes a portion of a corresponding adjacent conductive loop, the corresponding adjacent conductive loops conducting respective currents that rotate in a direction opposite to the direction of rotation of the first current.

19. The apparatus as recited in claim 11, wherein the first conductive loop is rectangular and comprises second, third, and fourth conductive portions shared with third, fourth, and fifth conductive loops, respectively.

20. The apparatus as recited in claim 19, wherein the second and third conductive portions form entire second and third sides, respectively, of the first conductive loop, and wherein the fourth conductive portion and a fifth conductive portion of the first conductive loop are separated by a gap, the fourth and fifth conductive portions being included in a fourth side of the first conductive loop.

21. The apparatus as recited in claim 11, wherein the width of the first conductive portion is approximately twice the width of other portions of the first conductive loop and approximately twice the width of other portions of the second conductive loop.

22. The apparatus as recited in claim 11, further comprising:
an oscillator circuit including the first conductive loop, the second conductive loop, and a capacitor coupled in parallel with the first conductive loop and the second conductive loop.

23. The apparatus as recited in claim 11,
wherein the first conductive loop and the second conductive loop further share a second conductive portion that forms a part of the first conductive loop and a part of the second conductive loop, the first conductive portion and the second conductive portion being separated by a gap, the first conductive portion including a first terminal and the second conductive portion including a second terminal, the first and second terminals being configured to couple the first conductive loop in parallel with the second conductive loop.

24. The apparatus as recited in claim 11,
wherein the first conductive loop includes a slot that causes distribution of current flowing in the first conductive loop.

25. An apparatus comprising:
a first conductive loop coupled to conduct a first current; and
a second conductive loop coupled in parallel with the first conductive loop and further coupled to conduct a second current;
wherein a first conductive portion forms a part of the first conductive loop and a part of the second conductive loop, the first conductive portion coupled to conduct the first current and the second current,
wherein the width of the first conductive portion is twice the width of other portions of the first conductive loop and twice the width of other portions of the second conductive loop.

26. The apparatus as recited in claim 25, further comprising:
an oscillator circuit including the first conductive loop, the second conductive loop, and a capacitor coupled in parallel with the first conductive loop and the second conductive loop.

27. The apparatus as recited in claim 25,
wherein the first conductive loop and the second conductive loop further share a second conductive portion that forms a part of the first conductive loop and a part of the second conductive loop, the first conductive portion and the second conductive portion being separated by a gap, the first conductive portion including a first terminal and the second conductive portion including a second terminal, the first and second terminals being configured to couple the first conductive loop in parallel with the second conductive loop.

28. The apparatus as recited in claim 25,
wherein the first conductive loop includes a slot that causes distribution of current flowing in the first conductive loop.

* * * * *

UNITED STATES PATENT AND TRADEMARK OFFICE
CERTIFICATE OF CORRECTION

PATENT NO. : 8,648,664 B2  
APPLICATION NO. : 13/250455  
DATED : February 11, 2014  
INVENTOR(S) : Adam B. Eldredge and Susumu Hara Page 1 of 1

It is certified that error appears in the above-identified patent and that said Letters Patent is hereby corrected as shown below:

In the Claims:

In claim 1, line 6, please replace ":" with --;--.

Signed and Sealed this  
Sixth Day of May, 2014

Michelle K. Lee  
*Deputy Director of the United States Patent and Trademark Office*

UNITED STATES PATENT AND TRADEMARK OFFICE
CERTIFICATE OF CORRECTION

Page 1 of 1

PATENT NO. : 8,648,664 B2
APPLICATION NO. : 13/250455
DATED : February 11, 2014
INVENTOR(S) : Adam B. Eldredge and Susumu Hara It is certified that error appears in the above-identified patent and that said Letters Patent is hereby corrected as shown below:

In the Claims:

Column 9, line 57, in claim 1, please replace ":" with --;--.

This certificate supersedes the Certificate of Correction issued May 6, 2014.

Signed and Sealed this
Tenth Day of June, 2014

Michelle K. Lee
*Deputy Director of the United States Patent and Trademark Office*